(12) United States Patent
Hwang

(10) Patent No.: US 7,700,396 B2
(45) Date of Patent: Apr. 20, 2010

(54) IMAGE SENSOR AND FABRICATING METHOD THEREOF

(75) Inventor: Sang-Il Hwang, Kangwon-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 225 days.

(21) Appl. No.: 11/869,551

(22) Filed: Oct. 9, 2007

(65) Prior Publication Data

US 2008/0093642 A1 Apr. 24, 2008

(30) Foreign Application Priority Data

Oct. 20, 2006 (KR) .................... 10-2006-0102214

(51) Int. Cl.
*H01L 21/00* (2006.01)

(52) U.S. Cl. .................... 438/48; 257/252; 257/258

(58) Field of Classification Search .............. None
See application file for complete search history.

(56) References Cited

U.S. PATENT DOCUMENTS

| 2006/0022205 A1* | 2/2006 | Park et al. ............... 257/80 |
| 2007/0155036 A1* | 7/2007 | Shim ..................... 438/48 |
| 2007/0155041 A1* | 7/2007 | Kim ...................... 438/59 |
| 2007/0161142 A1* | 7/2007 | Mouli et al. ............. 438/57 |
| 2008/0093642 A1* | 4/2008 | Hwang .................. 257/292 |
| 2009/0127598 A1* | 5/2009 | Shim .................... 257/292 |
| 2009/0166695 A1* | 7/2009 | Kim ..................... 257/292 |

FOREIGN PATENT DOCUMENTS

| KR | 1020050118903 A | | 12/2005 |
| KR | 1020050118903 A | * | 12/2005 |
| KR | 1020060000322 A | * | 1/2006 |
| KR | 1020060002260 A | * | 1/2006 |

\* cited by examiner

*Primary Examiner*—Ha Tran T Nguyen
*Assistant Examiner*—Shantanu C Pathak
(74) *Attorney, Agent, or Firm*—Sherr & Vaughn, PLLC

(57) ABSTRACT

Embodiments relate to an image sensor having a gate spacer and a fabricating method by which damage in a photodiode area can be prevented. Embodiments relate to a method of fabricating an image sensor including forming a gate electrode over a substrate having a prescribed photodiode area. A first oxide layer, a nitride layer, and a second oxide layer may be formed over the substrate including the gate electrode. A photoresist pattern may be formed over the substrate to open the photodiode area centering on the gate electrode. A transformed nitride layer may be formed by selectively carrying out nitridation on the second oxide layer formed over the photodiode area centering on the gate electrode using the photoresist pattern as a mask. The photoresist mask pattern may be removed. A spacer may be formed over one side of the gate electrode by carrying out blank etch on the first oxide layer, the nitride layer, the transformed nitride layer, and the second oxide layer.

16 Claims, 5 Drawing Sheets

IMAGE SENSOR AND FABRICATING METHOD THEREOF

The present application claims priority under 35 U.S.C. 119 to Korean Patent Application No. 10-2006-0102214, filed on Oct. 20, 2006, which is hereby incorporated by reference in its entirety.

BACKGROUND

Generally, an image sensor is a semiconductor device that converts an optical image to an electric signal. A charge coupled device (CCD) is an image sensor which includes a plurality of MOS (Metal-Oxide-Silicon) capacitors in the vicinity of each other. Charge carriers are stored in the capacitors and transferred.

A CMOS image sensor employs CMOS technology which may integrate a control circuit and a signal processing circuit as peripheral circuits on the sensor chip. The CMOS image sensor includes a number of MOS transistors matching the number of pixels. A CMOS sensor may employ a switching system for sequentially detecting outputs using the MOS transistors.

An image sensor has a photo-sensing section for generating and accumulating charges liberated by the photoelectric effect by incoming light. A color filter is arranged on the photo-sensing section. A color filter array (CFA) may include red, green, and blue, or yellow, magenta, and cyan. The image sensor may include a photo-sensing section for sensing light and a logic circuit section for processing the sensed light as electrical signals used to represent image data.

To increase photosensitivity, efforts have been made to increase a fill factor of the photo-sensing section over the whole image sensor device. Because of the logic circuit section, the efforts are restricted by the limited area. To increase photosensitivity by another method, a light-condensing technology for concentrating incident light on the photosensing section has been introduced. For this purpose, a microlens is formed over a color filter of an image sensor.

FIG. 1 is a diagram of an equivalent circuit of a unit pixel (indicated by a dotted line) in a CMOS image sensor according to a related art. Referring to FIG. 1, a unit pixel of a CMOS image sensor includes of a photodiode PD and four NMOS transistors Tx, Rx, Sx, and Dx. Transfer transistor Tx is for transferring charges collected by the photodiode PD to a floating diffusion area FD. Reset transistor Rx is for resetting the floating diffusion area FD by setting a potential of a node to a specific value and draining charges $C_{pd}$. Drive transistor Dx plays a role as a source-follower buffer amplifier. A select transistor Sx enables switched addressing. The transfer and reset transistors Tx and Rx are native NMOS transistors, while the drive and select transistors Dx and Sx are normal NMOS transistors. The reset transistor Rx is provided for CDS (correlated double sampling).

The unit pixel of the CMOS image sensor, as shown in FIG. 1, senses light in a visible wavelength band in the photodiode area PD using the native transistors, and then outputs the sensed photo-generated charge. This corresponds to the quantity of charge delivered to the floating diffusion area FD, i.e., the electrical signal at the gate of the drive transistor Dx, from an output terminal $V_{out}$.

FIG. 2A and FIG. 2B are cross-sectional diagrams of a method of fabricating a CMOS image sensor according to a related art. A photodiode and a transfer transistor Tx for transferring photogenerated charges from the photodiode (PD) to a floating diffusion area (FD) are shown. A method of fabricating an image sensor according to a related art is briefly explained with reference to the drawings as follows.

Referring to FIG. 2A, a p-epitaxial layer (not shown in the drawing) lightly doped with p type impurities, a field oxide layer (not shown in the drawing) for isolation between unit pixels, and a photodiode area 210 are formed over a p+substrate 200 heavily doped with p type impurities by LOCOS (local oxidation of silicon) and ion implantation. A gate electrode 220 of a transfer transistor Tx is formed over the p-epitaxial layer. Gates (not shown in the drawing) of drive, reset, and select transistors Dx, Rx, and Sx can be simultaneously formed. To form a spacer attached to one sidewall of the gate electrode 220 of the transfer transistor, an insulating layer for a spacer, e.g., an ONO (oxide/nitride/oxide) layer 230/240/250 is deposited over the substrate. After a photoresist layer has been formed over the ONO layer 230/240/250, the photoresist layer is etched to form pattern 260 to protect the photodiode area 210.

Referring to FIG. 2B, an RIE (reactive ion etch) is carried out on the ONO layer 230/240/250 using the photoresist pattern 260 as a mask. A spacer 270 attached to one sidewall of the gate electrode 220 of the transfer transistor is formed by the RIE. However, since selectivity of the photoresist for the RIE to form the spacer 270, as shown in FIG. 2B, is not high, most of the photoresist pattern formed to protect the photodiode area 210 is etched away. The oxide layer 250 beneath the photoresist pattern 260 is also etched in part.

Where the spacer 270 attached to one sidewall of the gate electrode 220 of the transfer transistor is formed by an RIE on the ONO layer in the related art image sensor having the photodiode area 210, the photodiode area, as shown in FIG. 2C, is over-etched, exposing the photodiode. This causes a damage (A) to the image sensor, shown in FIG. 2C, which may degrade performance of the image sensor.

SUMMARY

Embodiments relate to an image sensor having a gate spacer and a fabricating method by which damage in a photodiode area can be prevented. Embodiments relate to a method of fabricating an image sensor including forming a gate electrode over a substrate having a prescribed photodiode area. A first oxide layer, a nitride layer, and a second oxide layer may be formed over the substrate including the gate electrode. A photoresist pattern may be formed over the substrate to open the photodiode area centering on the gate electrode. A transformed nitride layer may be formed by selectively carrying out nitridation on the second oxide layer formed over the photodiode area centering on the gate electrode using the photoresist pattern as a mask. The photoresist mask pattern may be removed. A spacer may be formed over one side of the gate electrode by carrying out blank etch on the first oxide layer, the nitride layer, the transformed nitride layer, and the second oxide layer.

Embodiments relate to an image sensor which includes a substrate having a prescribed photodiode area. The sensor has a gate electrode on the substrate next to the photodiode area. A first oxide layer and a transformed nitride layer over the photodiode area are centered on the gate electrode. A spacer covers one side of the electrode in correspondence to the first oxide layer and the transformed nitride layer.

DRAWINGS

Figure 1:
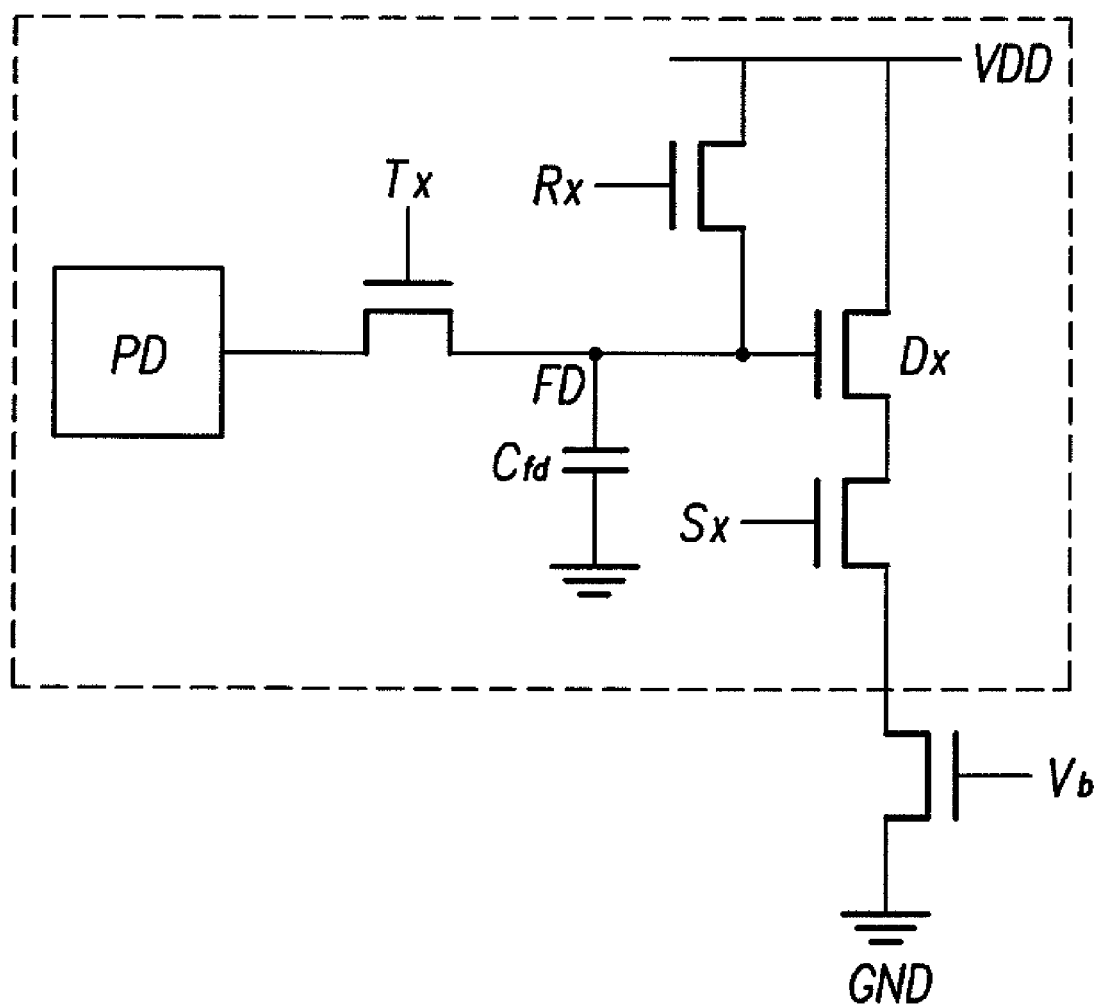
FIG. 1 is a diagram of an equivalent circuit of a unit pixel (indicated by a dotted line) of a CMOS image sensor according to related art.
Figure 2A:
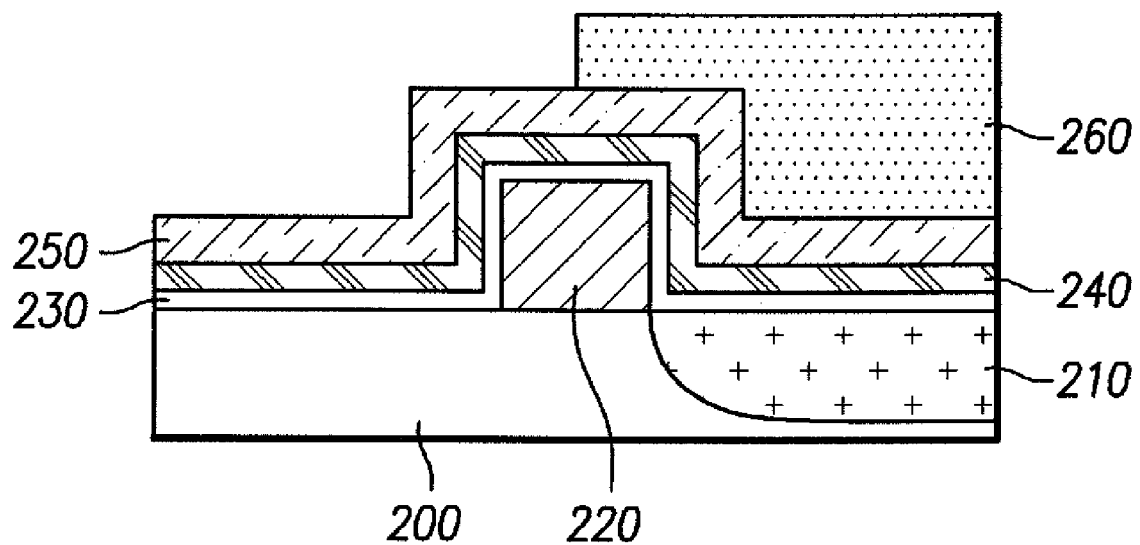
FIG. 2A and FIG. 2B are cross-sectional diagrams of a method of fabricating a CMOS image sensor according to related art.
Figure 2B:
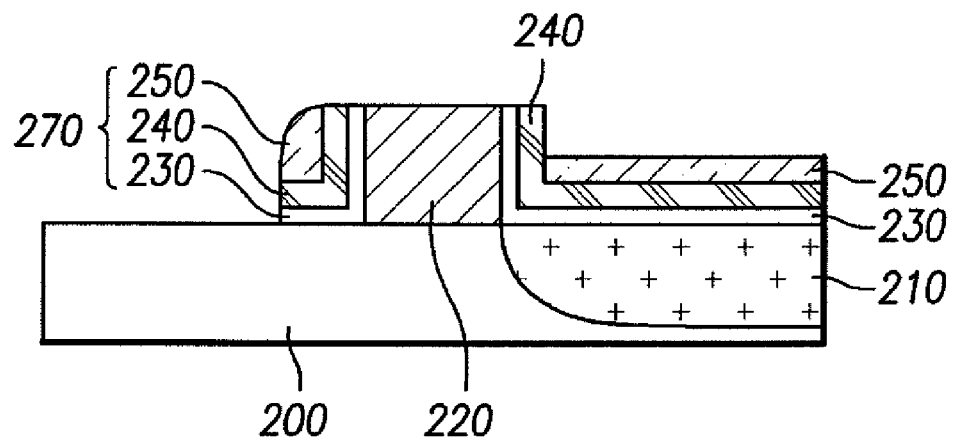
Figure 2C:
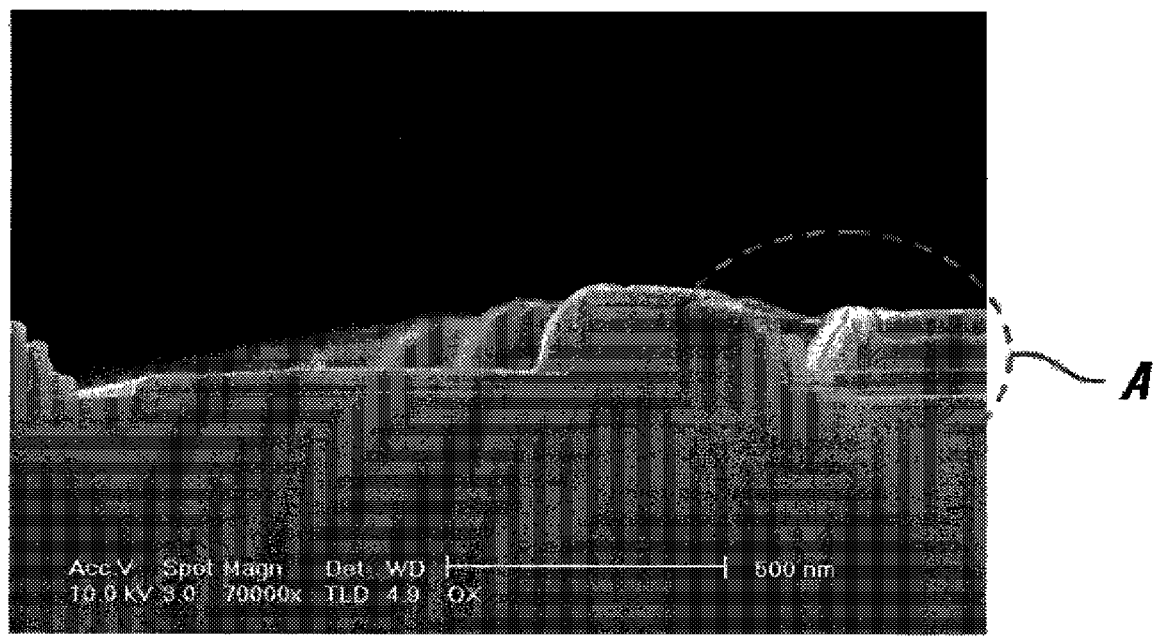
FIG. 2C is a picture of an example of over-etching damage in a photodiode area in a related art CMOS image sensor.

Example FIGS. 3A to 3D are cross-sectional diagrams of a method of fabricating an image sensor according to embodiments.

DESCRIPTION

Example FIGS. 3A to 3D are cross-sectional diagrams of a method of fabricating an image sensor according to embodiments. Referring to example FIG. 3A, a gate electrode 320, to which a driving signal is applied, is formed over a substrate 300 having a prescribed photodiode area 310. The substrate 300 includes may include one of a silicon substrate, an SOI (silicon on insulator) substrate, a Ga—As substrate, a Si—Ge substrate, and a ceramic substrate.

An stacked ONO (oxide/nitride/oxide) layer may be formed over the whole surface of the substrate 300 including the gate electrode 320 and the photodiode area 310 by depositing a first oxide layer 330, a nitride layer 340, and a second oxide layer 350 over the substrate 300. The first oxide layer 300 may be 180 to 220 Å thick. The nitride layer 340 may be 180 to 220 Å thick. The second oxide layer 350 may be 720 to 880 Å thick. A photoresist may be coated over the whole surface of the substrate 300 including the ONO layer over the gate electrode 320. The photoresist may be formed into a photoresist pattern 360, as shown in example FIG. 3A, having a predetermined thickness, to open the photodiode area 310. The photoresist pattern 360 will be used as a mask for selective nitridation of the second oxide layer 350 of the ONO layer attached to the other side of the photodiode area 310.

Figure 3A:
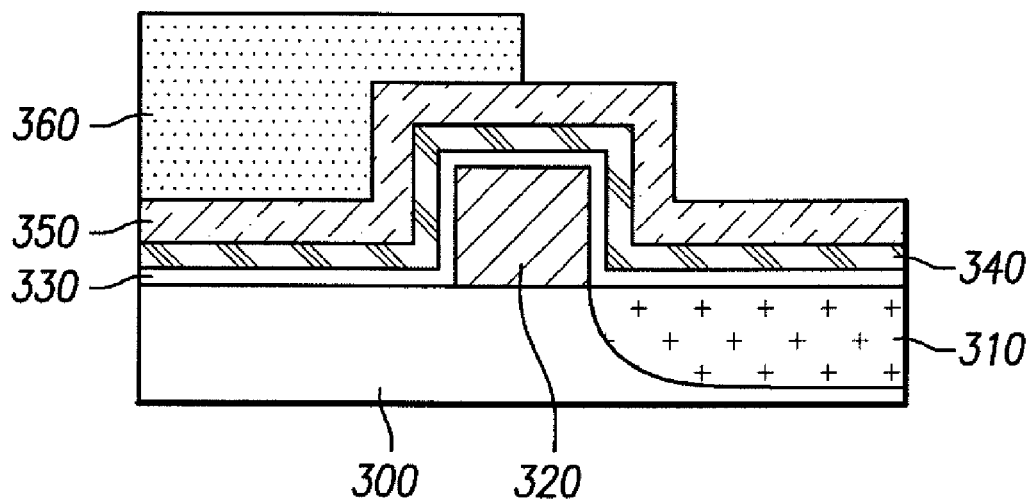
Figure 3B:
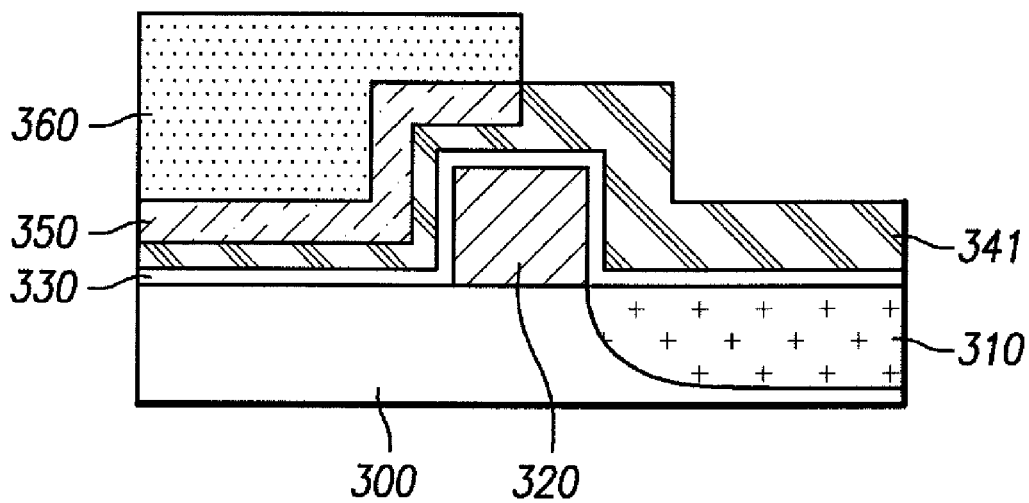

Referring to example FIG. 3B, after the photoresist pattern 360 has been defined, nitridation may be carried out over an area except the photoresist pattern 360, e.g., the second oxide layer 350 of the ONO layer over the photodiode area 310, using the photoresist pattern 360 as a mask. The nitridation may be carried out for 1 to 10 minutes using plasma from $N_2$ gas at 150 to 250 sccm, at an ambient pressure of 15 to 25 mTorr, with RF power of 1,000 to 1,500 W. By performing the nitridation over the second oxide layer 350 over the photodiode area 310, a transformed nitride layer 341 is selectively thickened using the second oxide layer 350.

Figure 3C:
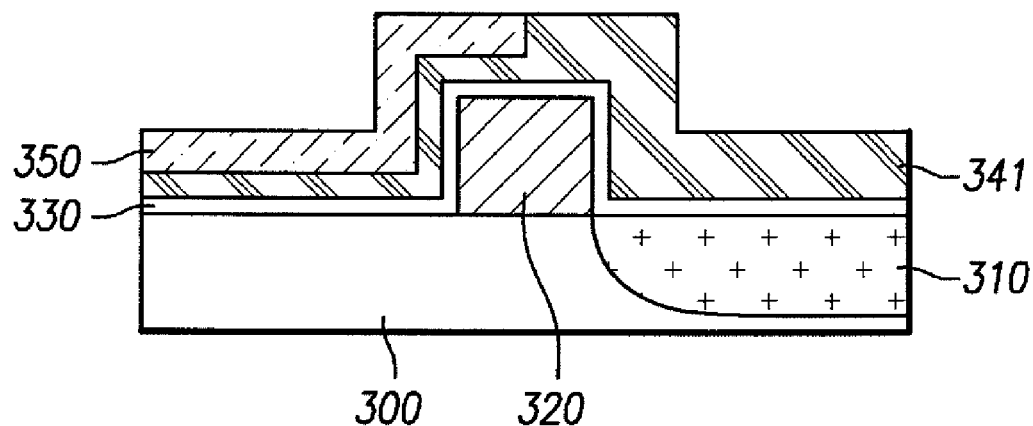

Referring to example FIG. 3C, the photoresist pattern 360 is removed by ashing and cleaning. Over the photodiode area 310, the stacked layer includes the first oxide layer 330 and the transformed nitride layer 341 selectively made thick by the nitridation. The insulating layer of the ONO stacked structure remains intact opposite the photodiode area 310. In particular, the transformed nitride layer 341 selectively thickened by the nitridation and the nitride layer within the spacer may be formed at a ratio between approximately 5 to 1 and 10 to 1 centering on the gate electrode 320.

Figure 3D:
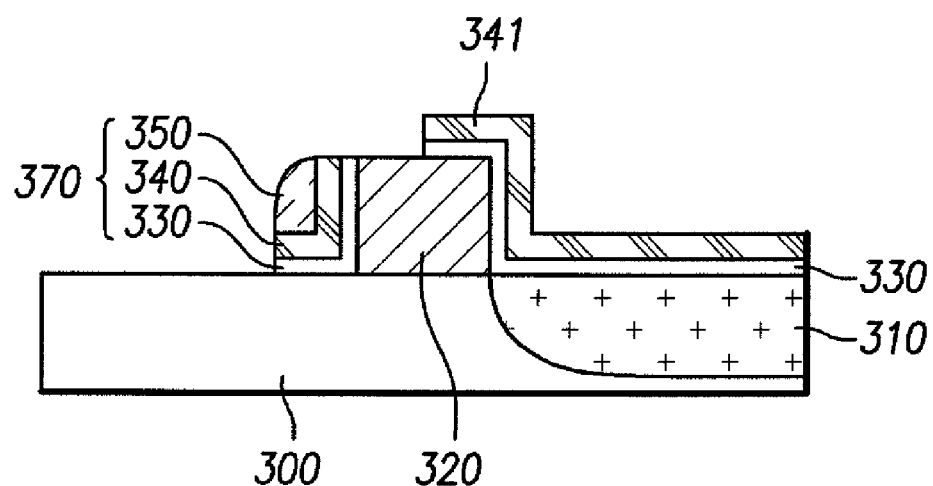

Referring to example FIG. 3D, a blank etch is carried out on the stacked structure including the first oxide layer 330, the nitride layer 340/341, and the second oxide layer 350 provided to the other side of the photodiode area 310 by RIE reactive ion etch). A spacer 370 is formed over a left side of the gate electrode 320, i.e., over the substrate 300 opposite the photodiode area 310. The transformed nitride layer 341 selectively thickened by the nitridation is partially etched to remain in a prescribed shape over the photodiode area 310 as the spacer 370 is formed over the substrate 300. Since the photodiode area is prevented from being exposed while forming the spacer for the gate electrode, performance of the image sensor in embodiments can be enhanced. Accordingly, embodiments solve the related art problem of the exposed photodiode area by preventing the photodiode area from being etched in the course of forming the spacer for the gate electrode, thereby enhancing the image sensor performance.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a gate electrode over a substrate having a photodiode area;
   forming a first oxide layer, a nitride layer, and a second oxide layer over the substrate including the gate electrode;
   forming a photoresist pattern over a portion of the substrate and a portion of the gate electrode to expose the second oxide layer over the photodiode area and a portion of the gate;
   forming a transformed nitride layer by selectively carrying out nitridation on the exposed portion of the second oxide layer formed over the photodiode area and a portion of the gate electrode using the photoresist pattern as a mask;
   removing the photoresist pattern; and
   forming a spacer over a side of the gate electrode by carrying out a blank etch on the first oxide layer, the nitride layer, the transformed nitride layer, and the second oxide layer.

2. The method of claim 1, wherein the first oxide layer is approximately 180 to 220 Å thick.

3. The method of claim 1, wherein the nitride layer is approximately 180 to 220 Å thick.

4. The method of claim 1, wherein the second oxide layer is approximately 720 to 880 Å thick.

5. The method of claim 2, wherein the nitride layer is approximately 180 to 220 Å thick and the second oxide layer is approximately 720 to 880 Å thick.

6. The method of claim 1, wherein the nitridation is carried out for approximately 1 to 10 minutes.

7. The method of claim 1, wherein the nitridation uses plasma from $N_2$ gas at approximately 150 to 250 sccm.

8. The method of claim 1, wherein the nitridation is carried at an ambient pressure of approximately 15 to 25 mTorr.

9. The method of claim 1, wherein the nitridation is carried out with RF power of approximately 1,000 to 1,500 W.

10. The method of claim 1, wherein the nitridation is carried out for 1 to 10 minutes using plasma from $N_2$ gas at 150 to 250 sccm, at an ambient pressure of 15 to 25 mTorr, with RF power of 1,000 to 1,500 W.

11. The method of claim 1, wherein the spacer is formed over one side of the gate electrode by a reactive ion etch.

12. An apparatus configured to:
   form a gate electrode over a substrate having a photodiode area;
   form a first oxide layer, a nitride layer, and a second oxide layer over the substrate including the gate electrode;
   form a photoresist pattern over a portion of the substrate and gate electrode to expose the second oxide layer over the photodiode area and a portion of the gate;
   form a transformed nitride layer by selectively carrying out nitridation on the exposed portion of the second oxide layer formed over the photodiode area and a portion of the gate electrode using the photoresist pattern as a mask;

remove the photoresist pattern; and form a spacer over a side of the gate electrode by carrying out a blank etch on the first oxide layer, the nitride layer, the transformed nitride layer, and the second oxide layer.

13. The apparatus of claim 12 configured to form the first oxide layer approximately 180 to 220 Å thick, the nitride layer is approximately 180 to 220 Å thick, and the second oxide layer is approximately 720 to 880 Å thick.

14. The apparatus of claim 12 configured to carry out the nitridation for approximately 1 to 10 minutes.

15. The apparatus of claim 14 configured to carry out the nitridation using plasma from $N_2$ gas at 150 to 250 sccm, at an ambient pressure of 15 to 25 mTorr, with RF power of 1,000 to 1,500 W.

16. The apparatus of claim 12 configured to form the spacer over one side of the gate electrode by a reactive ion etch.

* * * * *